(12) United States Patent
Huang et al.

(10) Patent No.: US 9,413,573 B2
(45) Date of Patent: Aug. 9, 2016

(54) RECEIVER AND GAIN CONTROL METHOD THEREOF

(75) Inventors: Liang-Wei Huang, Taipei (TW);
Chih-Yung Shih, Taipei (TW);
Shieh-Hsing Kuo, Taipei Hsien (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 1206 days.

(21) Appl. No.: 12/317,160

(22) Filed: Dec. 19, 2008

(65) Prior Publication Data

US 2009/0161803 A1 Jun. 25, 2009

(30) Foreign Application Priority Data

Dec. 19, 2007 (TW) .............................. 96148654 A (51) Int. Cl.
*H04L 27/00* (2006.01)
*H03G 3/30* (2006.01)
*H04B 3/23* (2006.01)
*H04B 3/32* (2006.01)
*H04L 25/03* (2006.01)

(52) U.S. Cl.
CPC .......... *H04L 27/0002* (2013.01); *H03G 3/3068* (2013.01); *H04B 3/23* (2013.01); *H04B 3/32* (2013.01); *H04L 25/03057* (2013.01); *H04L 2025/0349* (2013.01)

(58) Field of Classification Search
CPC .................. H04L 27/0002; H04L 2025/0349; H04L 25/03057; H04B 3/32; H04B 3/23; H03G 3/3068

USPC ......... 375/345, 346, 316, 348, 222, 229, 230, 375/232, 233, 234; 455/130, 136, 232.1, 455/240.1, 321.1, 245.1, 245.2, 246.1, 455/247.1, 250.1, 251.1, 253.2; 370/201, 370/286, 287, 288, 289, 290, 291, 292
See application file for complete search history.

(56) References Cited

U.S. PATENT DOCUMENTS

| | | | |
|---|---|---|---|
| 5,165,017 A * | 11/1992 | Eddington et al. ............ 381/321 |
| 6,201,831 B1 * | 3/2001 | Agazzi et al. ................. 375/229 |
| 6,836,647 B2 * | 12/2004 | Rimini et al. .............. 455/226.2 |
| 6,961,422 B2 | 11/2005 | Boland |
| 7,092,514 B2 * | 8/2006 | Trump ..................... H03G 3/32 |
| | | | 379/390.03 |
| 7,218,905 B1 * | 5/2007 | Molnar et al. ............. 455/240.1 |
| 2004/0090981 A1 * | 5/2004 | Lin et al. ....................... 370/445 |
| 2006/0120491 A1 * | 6/2006 | Yen et al. ...................... 375/345 |
| 2007/0111687 A1 * | 5/2007 | Weng et al. ................ 455/127.5 |

* cited by examiner

*Primary Examiner* — Vineeta Panwalkar
(74) *Attorney, Agent, or Firm* — McClure, Qualey & Rodack, LLP (57) ABSTRACT

An analog and digital auto-gain control method includes the steps of: providing a gain-mapping table; determining an analog gain level according to a power of a far-end transmitted signal; obtaining a gain-mapping value from the gain-mapping table according to the analog gain level; obtaining a digital gain value according to the gain-mapping value; and adjusting a gain of a digital signal according to the digital gain value. A receiver that performs the auto-gain control method is also disclosed.

16 Claims, 9 Drawing Sheets

RECEIVER AND GAIN CONTROL METHOD THEREOF

CROSS-REFERENCE TO RELATED APPLICATION

This application claims priority of Taiwanese application no. 096148654, filed on Dec. 19, 2007, the subject matter of which is incorporated herein by reference.

BACKGROUND OF THE INVENTION

1. Field of the Invention

The invention relates to a communications system, more particularly to a receiver of a communications system and to an auto-gain control method of the receiver.

2. Description of the Related Art

The development of communications systems with high bit transmission rates is inevitable to cope with the explosion of digital information. Although there currently exists a 10 Gbase-Fiber (IEEE 802.3ae) standard, the use of fiber optics as a transmission medium does not meet requirements for low cost transmission. Therefore, a 10Gbase-T (IEEE 802.3an) standard was proposed, which uses a twisted-pair copper wire as a transmission medium in order to promote and make popular the establishment of ultra-high speed Ethernet systems.

Figure 1:
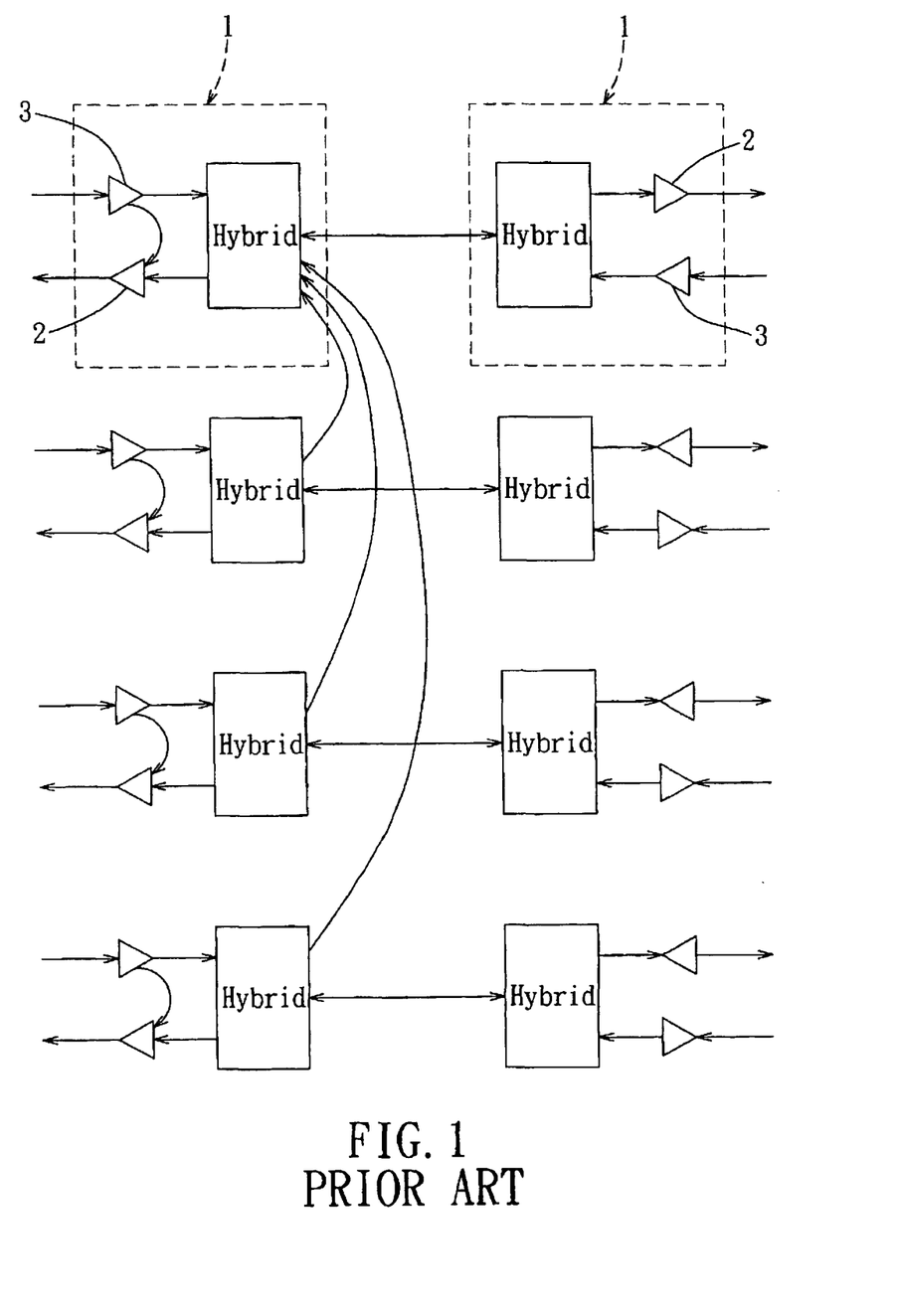
FIG. 1 is a schematic diagram of a conventional 10Gbase-T network transmission framework.

Referring to FIG. 1, in a conventional network transmission environment, each transceiver pair 1 comprises a receiver 2 and a transmitter 3. In general, the receiver 2 comprises components, such as an analog front end (AFE) unit, an analog-to-digital converter (ADC), a crosstalk suppressing unit, an equalizer, etc. The analog front end unit comprises an analog auto gain controller (AAGC). When establishing a connection, the receiver 2 will first determine signal power of the transmitter 3 before determining an optimum analog gain level of the analog auto gain controller.

In general, it is only after the analog gain level has been determined that the receiver 2 converges coefficients of the crosstalk suppressing unit, a feed forward equalizer and a feedback equalizer. Therefore, when the signal power of a far end or near end transmitter 3 changes, the analog gain level of the analog auto gain controller of the receiver 2 changes accordingly, such that the coefficients of the crosstalk suppressing unit, the feed forward equalizer and the feedback equalizer must be converged anew. Taking a 10 Gbase-T Ethernet network that complies with the IEEE 802.3an standard as an example, frequent adjustment of the signal power of the transmitter 3 is necessary when establishing a connection so as to avoid excessive signal power that can result in crosstalk with other receivers 2. Re-converging of coefficients can easily lead to disconnection and re-connection problems.

Therefore, in order to make the process of establishing a connection smoother, there is a need to dispense with re-converging of the coefficients of the receiver 2 whenever the signal power of the transmitter 3 is adjusted during connection establishment.

SUMMARY OF THE INVENTION

An object of the present invention is to provide a receiver and a method for gain control that can overcome the aforesaid drawbacks of the conventional communications system.

According to one aspect of the present invention, there is provided a method for gain control that comprises the steps of: providing a gain-mapping table; determining a first analog gain level according to power of a far-end transmitted signal; obtaining a first gain-mapping value from the gain-mapping table according to the first analog gain level; obtaining a first digital gain value according to the first gain-mapping value; and adjusting a gain of a digital signal according to the first digital gain value.

According to another aspect of the present invention, there is provided a receiver that comprises: an analog front end (AFE) including an analog auto gain controller (AAGC), the receiver determining a first analog gain level of the AAGC according to power of a transmitted signal transmitted by a far-end device; an analog-to-digital converter (ADC) for converting an output of the AFE into a digital signal; a first digital auto gain controller (DAGC), disposed in a data processing path, for adjusting a gain of the digital signal; and a gain processing unit including a gain-mapping table, the gain processing unit obtaining a first gain-mapping value from the gain-mapping table according to the first analog gain level, and obtaining a first digital gain value of the first DAGC according to the first gain-mapping value.

According to yet another aspect of the present invention, there is provided a receiver. The receiver comprises: an analog front end (AFE) for processing an analog signal received by the receiver, the AFE including an analog auto gain controller (AAGC) for adjusting an analog gain of the analog signal according to an analog gain value; an analog-to-digital converter (ADC) for converting a processed analog signal from the AFE into a digital signal; a data processing module for processing the digital signal from the ADC, the data processing module including a first digital auto gain controller (DAGC) for adjusting a gain of the digital signal according to a first digital gain value; and a gain processing unit coupled to the first DAGC for determining the first digital gain value according to the analog gain value.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail with reference to the accompanying preferred embodiments, it should be noted herein that like elements are denoted by the same reference numerals throughout the disclosure.

Figure 2:
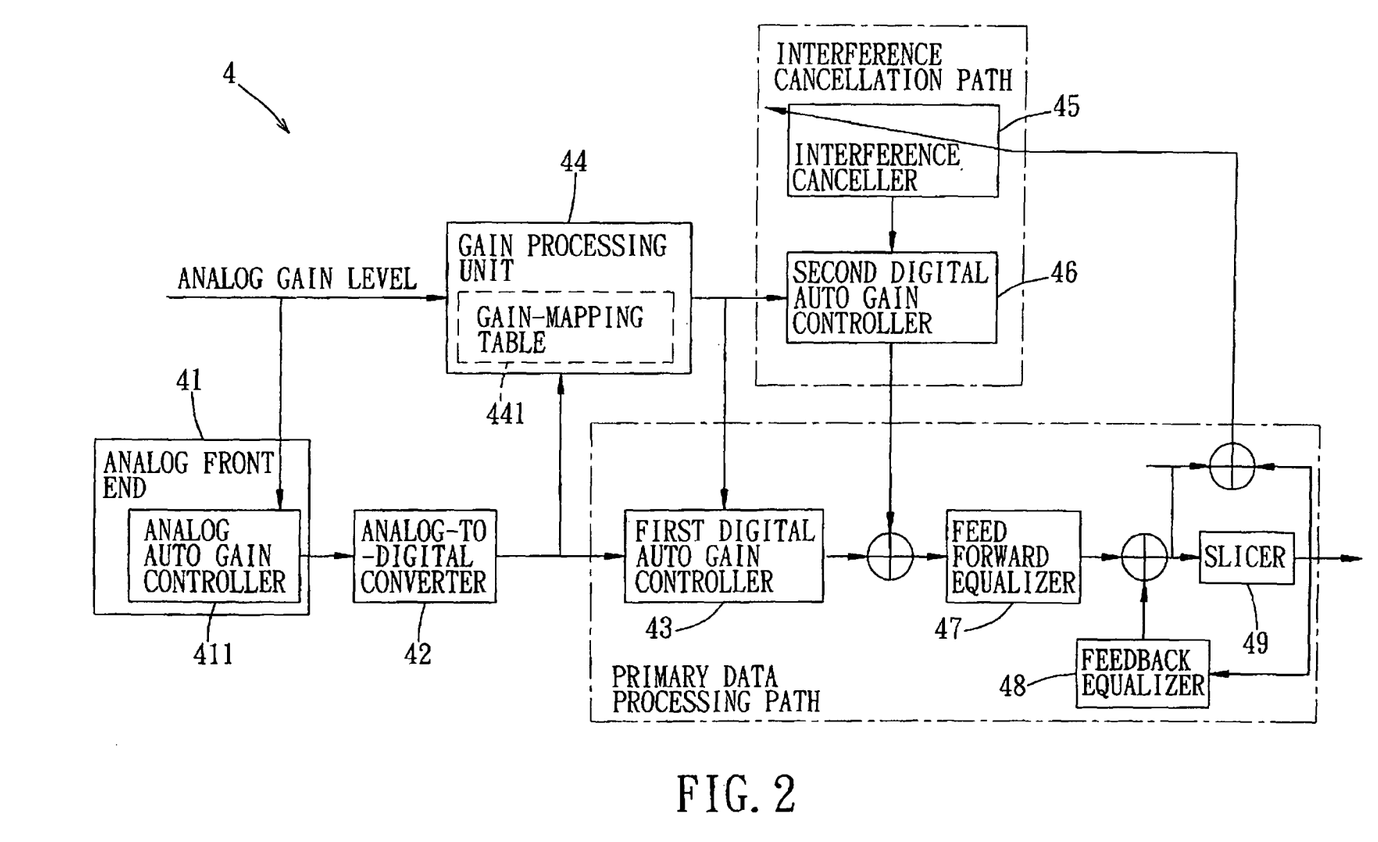
FIG. 2 is a system block diagram of the first preferred embodiment of a receiver according to the present invention.
Figure 3:
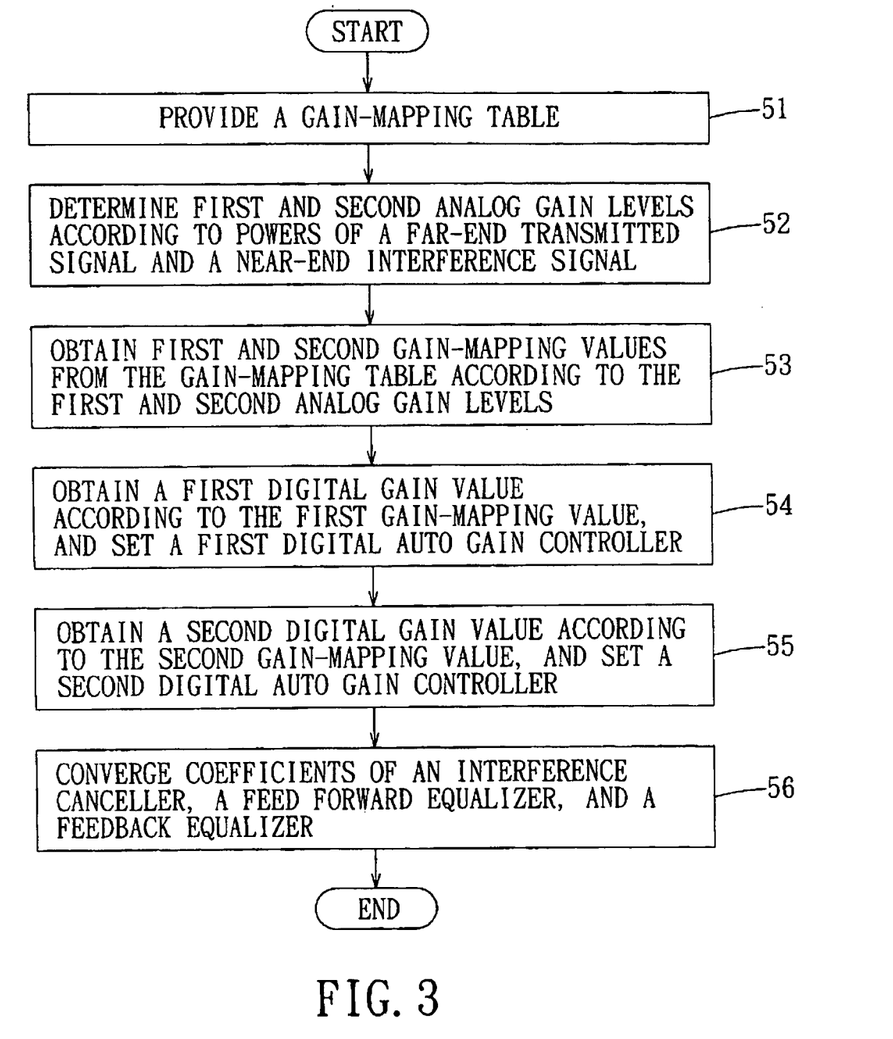
FIG. 3 is a flowchart of the first preferred embodiment of an analog and digital auto gain control method according to the present invention.

Referring to FIGS. 2 and 3, the first preferred embodiment of a receiver 4 according to the present invention is shown to include an analog front end (AFE) 41, an analog-to-digital converter (ADC) 42, a first digital auto gain controller (DAGC) 43, a gain processing unit 44, an interference canceller 45, a second digital auto gain controller (DAGC) 46, a feed forward equalizer (FFE) 47, a feedback equalizer (FBE) 48, and a slicer 49. The first DAGC 43, the FFE 47, the FBE 48 and the slicer 49 are disposed in a primary data processing path, whereas the interference canceller 45 and the second DAGC 46 are disposed in an interference cancellation path. The AFE 41 comprises an analog auto gain controller (AAGC) 411. The gain processing unit 44 comprises a gain-mapping table 441.

At the start, the AFE 41 receives an analog signal, and the AAGC 411 performs analog gain adjustment of the analog signal according to an analog gain value. The ADC 42 converts the analog signal processed by the AFE 41 into a digital signal, which is processed by the first DAGC 43. The output of the interference canceller 45 is processed by the second DAGC 46, and the outputs of the first and second DAGC 43, 46 are combined for subsequent processing in the primary data processing path. The first and second DAGC 43, 46 are controlled by the gain processing unit 44.

In the receiver 4, the interference canceller 45 disposed in the interference cancellation path is used to remove (cancel) noise, such as an echo, a near end crosstalk (NEXT), a far end crosstalk (FEXT), etc., whereas the FFE 47, the FBE 48 and the slicer 49 disposed in the primary data processing path are used to process a far end transmitted signal received by the receiver 4. Since the functions and operations of these components can be readily appreciated by those skilled in the art, further details of the same are omitted herein for the sake of brevity.

The first preferred embodiment of the analog and digital auto gain control (AGC) method of the present invention comprises the following steps.

In step 51, before establishing a network connection, the gain processing unit 44 provides a gain-mapping table 441. It is noted that the gain range of the AAGC 411 can vary among different receivers 4 due to factors, such as manufacturing drift, temperature, operational voltage, degradation of components, etc. Therefore, the gain-mapping table 441 is set before a network connection is established.

To set the gain-mapping table 441, a transmitter (not shown) of a transceiver is used to transmit a test signal, which is received by a receiver 4 of the transceiver. The AAGC 411 is set at a specified analog gain value (or analog gain level) at this time, and output power (recorded as a gain-mapping value) is measured at the output end of the ADC 42. By repeating the above steps for different analog gain levels, power differences among the analog gain levels of the AAGC 411 can be obtained for setting the gain-mapping table 441 (see Table 1).

TABLE 1

| Level of the analog auto gain controller | Gain-mapping value |
| --- | --- |
| analog gain level 1 | Gain-mapping value 1 |
| analog gain level 2 | Gain-mapping value 2 |
| ... | ... |
| analog gain level N | Gain-mapping value N |

In step 52, during the process of establishing a network connection, the receiver 4 will first determine the power of a transmitted signal to be transmitted to a far-end device, and the power of a far-end transmitted signal transmitted by a transmitter of the far-end device. The power of a near-end interference signal can be determined from the power of the transmitted signal to be transmitted to the far-end device. Then, the receiver 4 determines a first analog gain level of the AAGC 411 according to the power of the far-end transmitted signal, and a second analog gain level of the AAGC 411 according to the power of the near-end interference signal.

In steps 53 to 55, the gain processing unit 44 obtains a first gain-mapping value from the gain-mapping table 441 according to the first analog gain level, and then calculates a first digital gain value. In an embodiment, the first digital gain value is an inverse of the first gain-mapping value. The first digital gain value is used to set the first DAGC 43. In a similar manner, the gain processing unit 44 obtains a second gain-mapping value from the gain-mapping table 441 according to the second analog gain level, and then generates a second digital gain value. In an embodiment, the second digital gain value is an inverse of the second gain-mapping value. The second digital gain value is used to set the second DAGC 46.

In step 56, the coefficients of the interference canceller 45, the FFE 47 and the FBE 48 can be converged after the step 55, and need not undergo re-converging.

Figure 4:
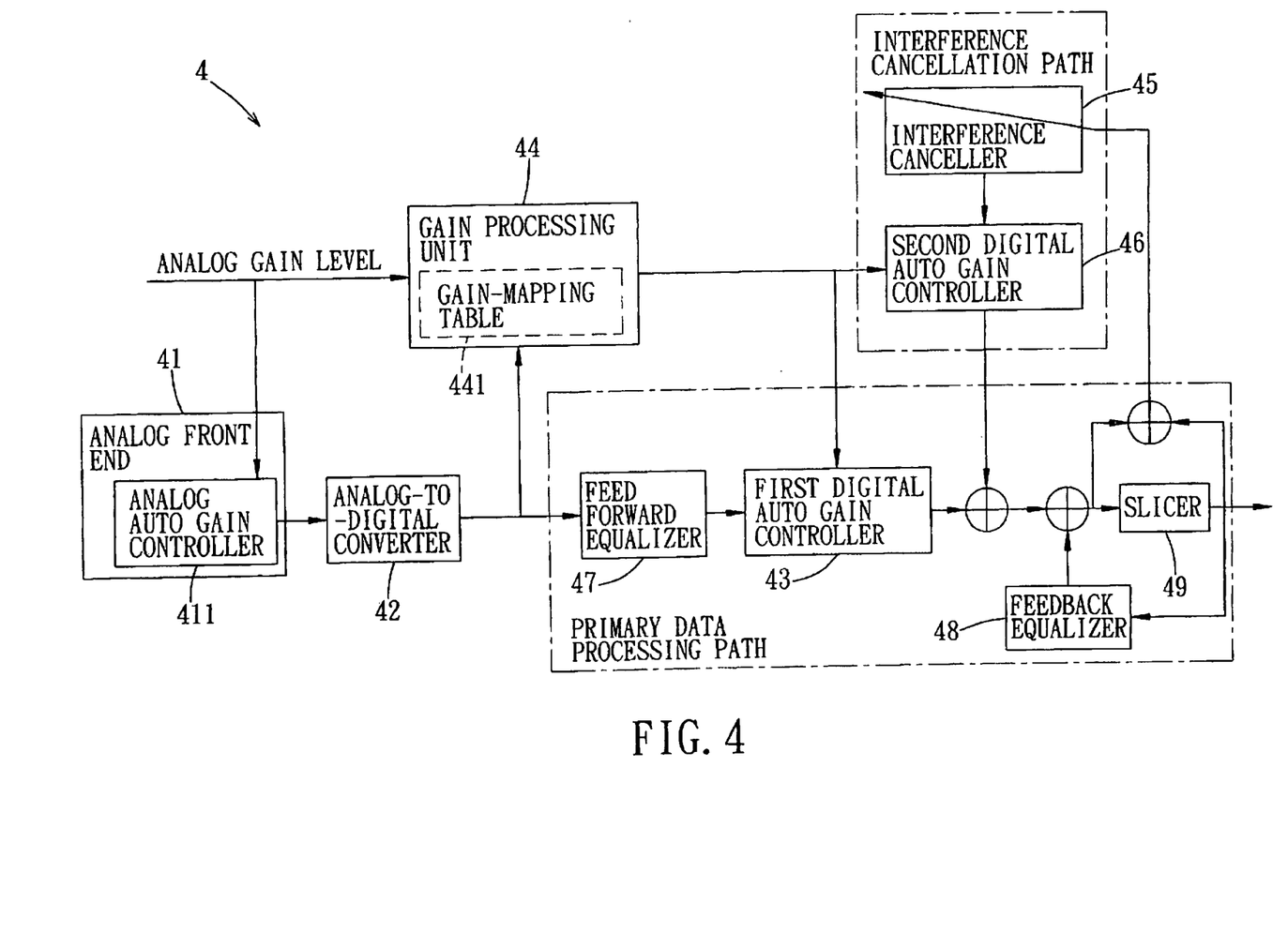
FIG. 4 is a system block diagram of the second preferred embodiment of a receiver according to the present invention.

Referring to FIG. 4, the second preferred embodiment of a receiver 4 according to this invention comprises the AFE 41, the ADC 42, the first DAGC 43, the gain processing unit 44, the interference canceller 45, the second DAGC 46, the FFE 47, the FBE 48 and the slicer 49 shown in FIG. 2. The functions of these components are similar to those in the first preferred embodiment. The second preferred embodiment differs from the first preferred embodiment in that: The digital signal from the ADC 42 is first processed by the FFE 47 before undergoing processing by the first DAGC 43. Like the previous embodiment, the output of the interference canceller 45 is processed by the second DAGC 46, and the outputs of the first and second DAGC 43, 46 are combined for subsequent processing in the primary data processing path. The first DAGC 43 and the second DAGC 46 are set by the gain processing unit 44 in a manner similar to that in the first preferred embodiment.

Figure 5:
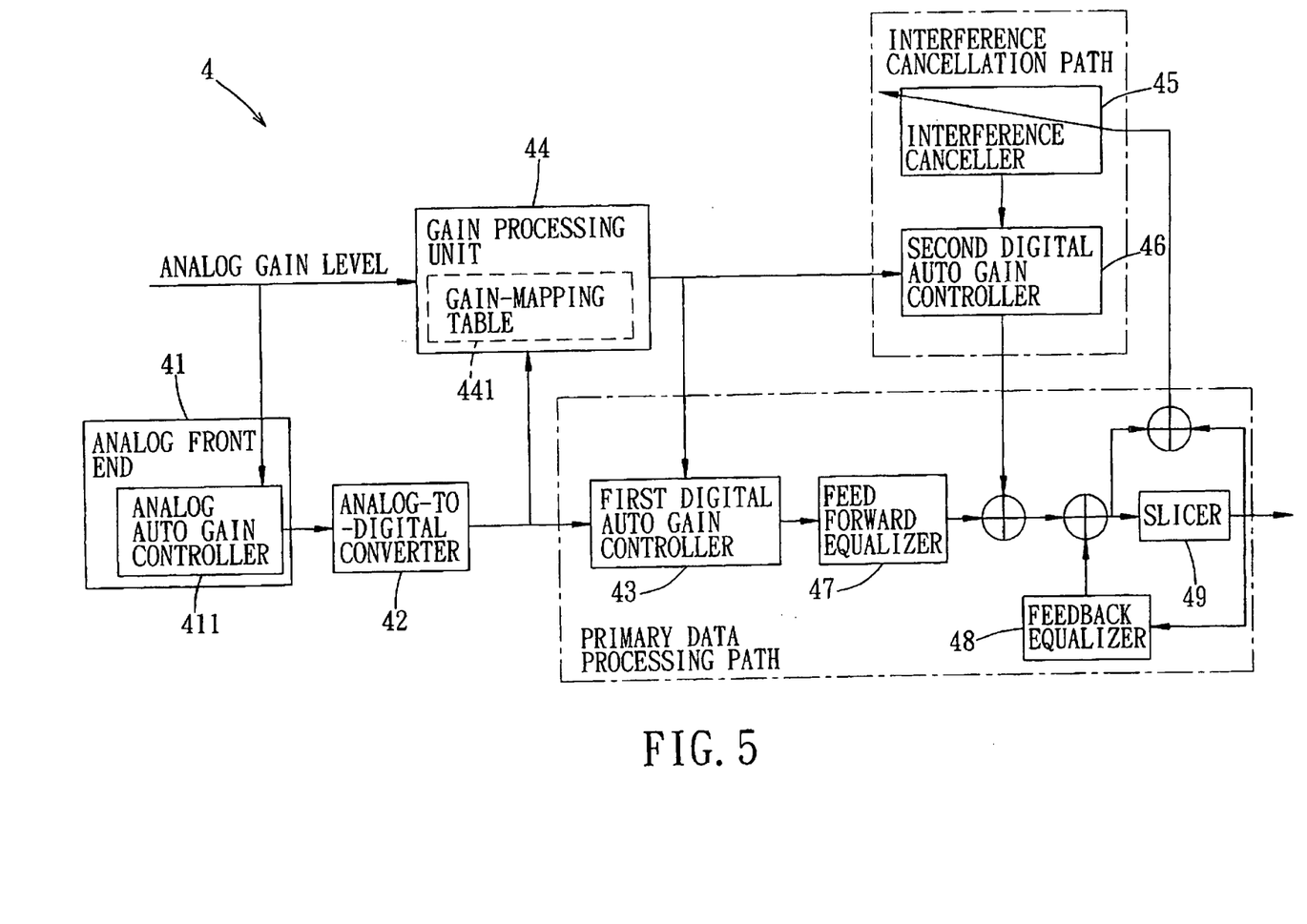
FIG. 5 is a system block diagram of the third preferred embodiment of a receiver according to the present invention.

Referring to FIG. 5, the third preferred embodiment of a receiver 4 according to this invention is disclosed. The functions of the components of the third preferred embodiment are similar to those of the first preferred embodiment. The third preferred embodiment differs from the first preferred embodiment in that: The output of the first DAGC 43 is first processed by the FFE 47, and the outputs of the FFE 47 and the second DAGC 46, which is responsible for processing the output of the interference canceller 45, are combined for subsequent processing in the primary data processing path. The first DAGC 43 and the second DAGC 46 are set by the gain processing unit 44 in a manner similar to that in the first preferred embodiment.

Figure 6:
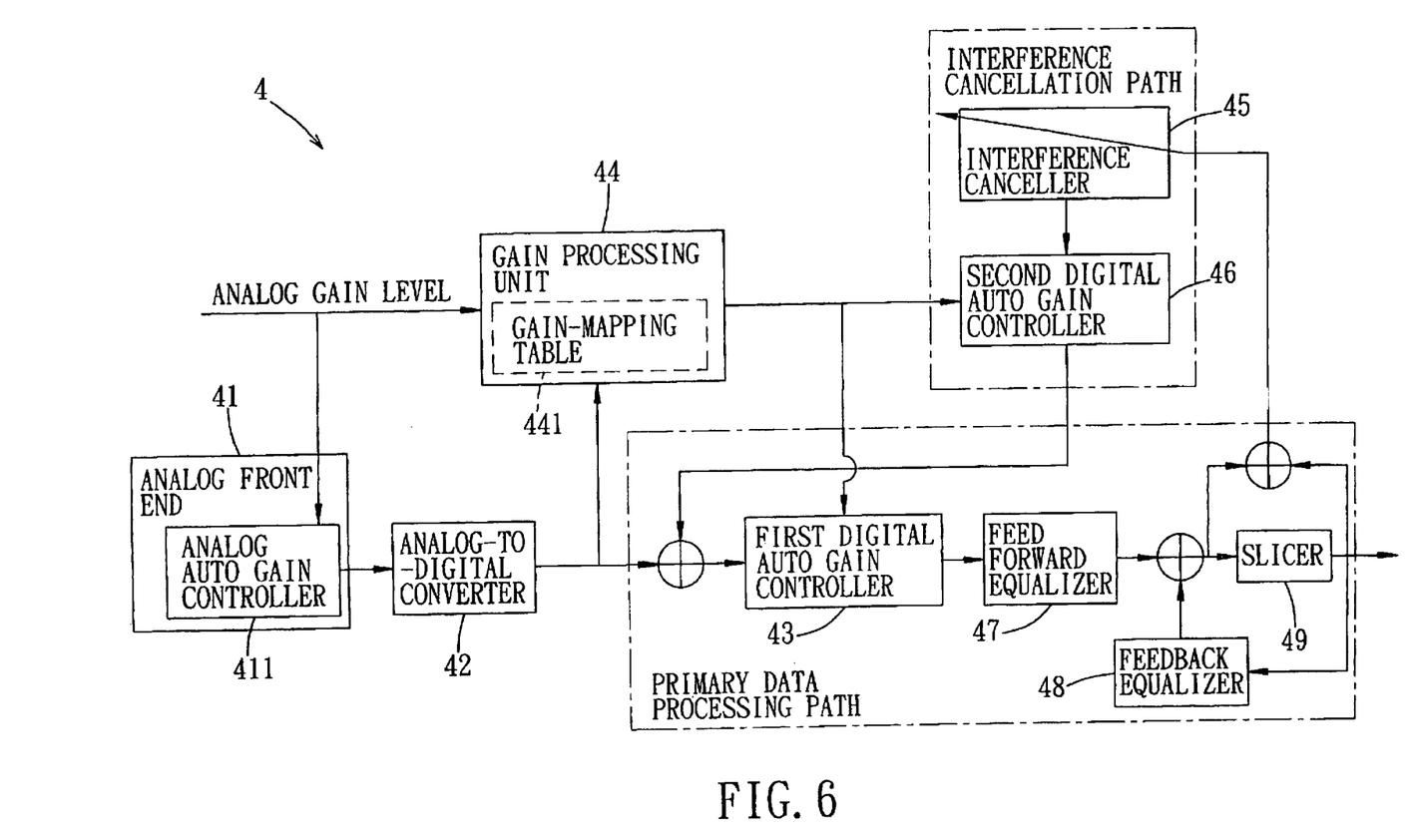
FIG. 6 is a system block diagram of the fourth preferred embodiment of a receiver according to the present invention.
Figure 7:
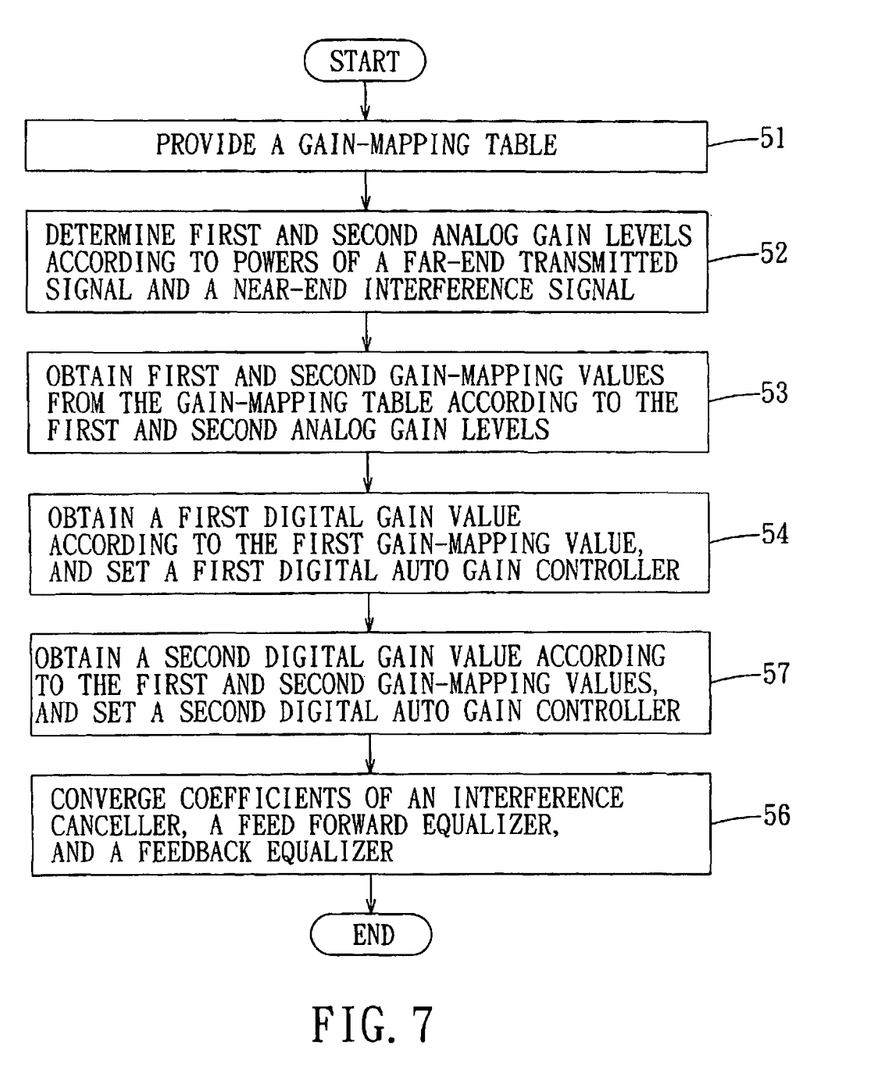
FIG. 7 is a flowchart of the fourth preferred embodiment of an analog and digital auto gain control method according to the present invention.

FIGS. 6 and 7 show the fourth preferred embodiment of a receiver 4 according to this invention. The functions of the components of the fourth preferred embodiment are similar to those of the first preferred embodiment. The fourth preferred embodiment differs from the first preferred embodiment in that: The output of the second DAGC 46, which is responsible for processing the output of the interference canceller 45, is combined with the digital signal from the ADC 42 to result in a combined signal. The combined signal is processed by the first DAGC 43 before undergoing further processing in the primary data processing path. Moreover, the gain processing unit 44 generates the second digital gain value in a different manner.

The fourth preferred embodiment of the analog and digital AGC method of the present invention comprises steps similar to those in the first preferred embodiment. The method of the fourth preferred embodiment differs from the first preferred embodiment in the calculation of the second digital gain value. As shown in step 57 in FIG. 7, the second digital gain value is generated according to the first and second gain-mapping values. In this embodiment, the second digital gain value is a product of the first gain-mapping value and an inverse of the second gain-mapping value.

Figure 8:
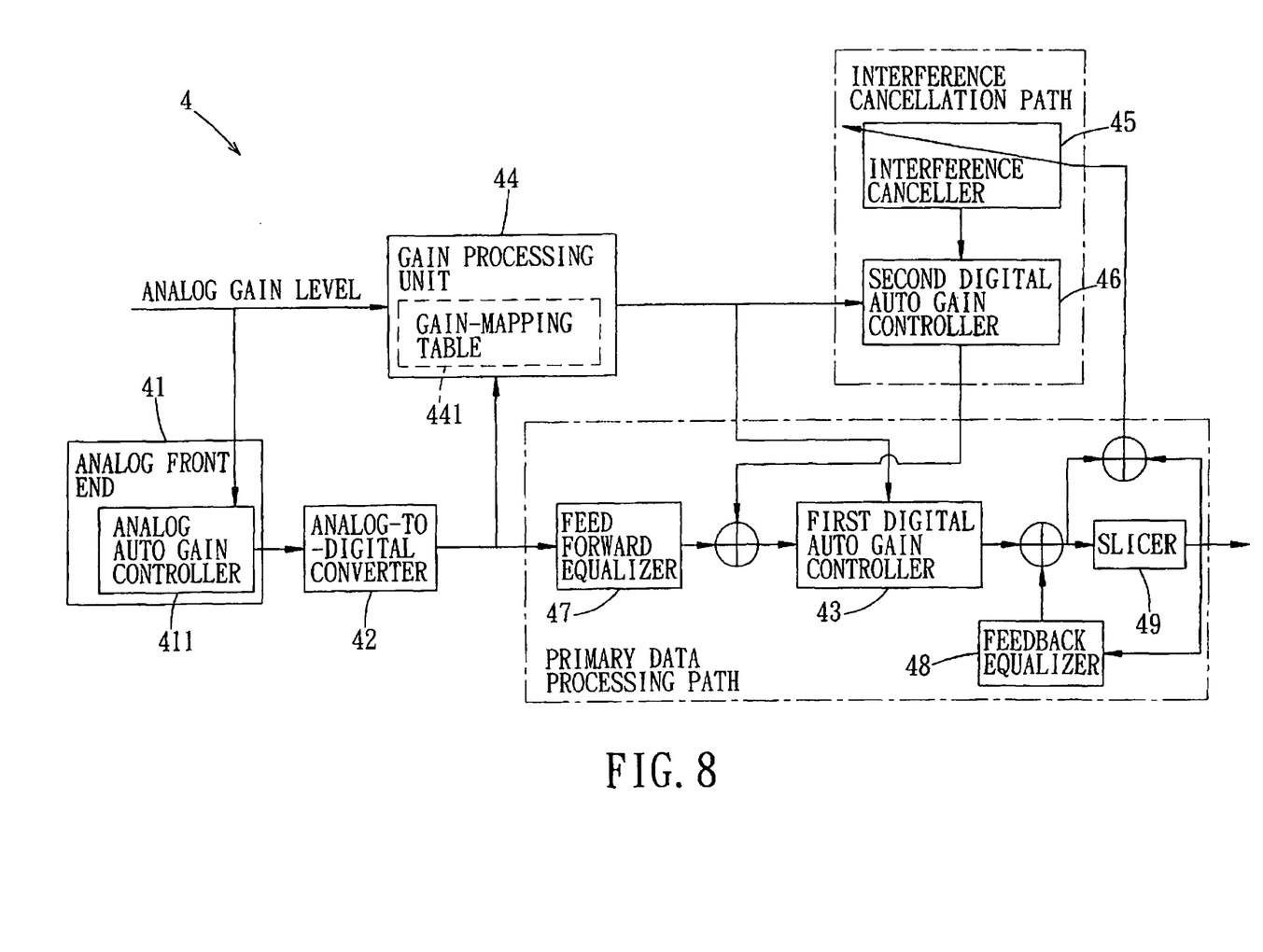
FIG. 8 is a system block diagram of the fifth preferred embodiment of a receiver according to the present invention.

FIG. 8 shows the fifth preferred embodiment of a receiver 4 according to this invention. The functions of the components of the fifth preferred embodiment are similar to those of the fourth preferred embodiment. The fifth preferred embodiment differs from the fourth preferred embodiment in that: The digital signal from the ADC 42 is first processed by the FFE 47, and the output of the second DAGC 46, which is responsible for processing the output of the interference canceller 45, is combined with the output of the FFE 47 to result in a combined signal. The combined signal is then processed by the first DAGC 43 before undergoing further processing in the primary data processing path. The first DAGC 43 and the second DAGC 46 are set by the gain processing unit 44 in a manner similar to that in the fourth preferred embodiment.

Figure 9:
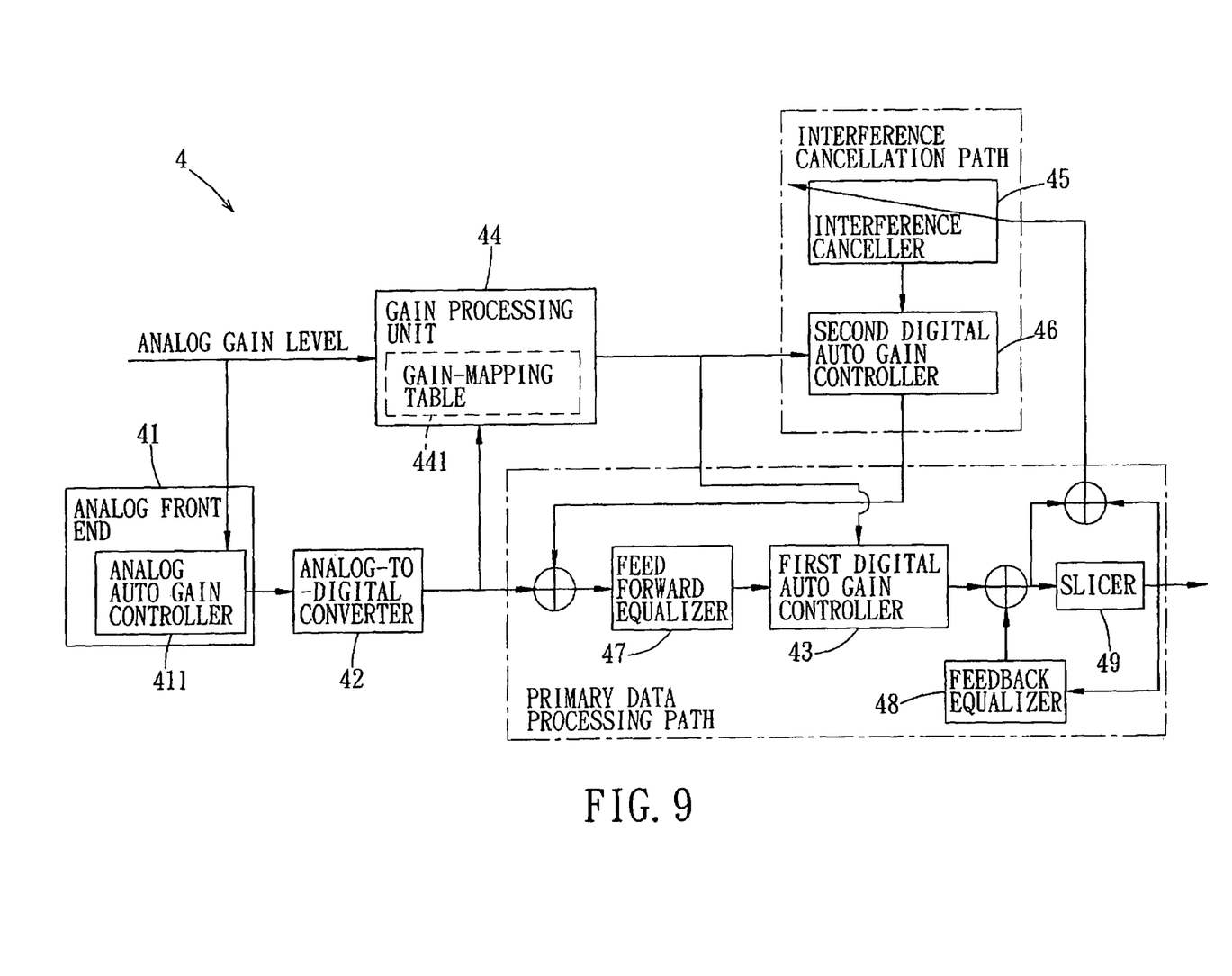
FIG. 9 is a system block diagram of the sixth preferred embodiment of a receiver according to the present invention.

FIG. 9 shows the sixth preferred embodiment of a receiver 4 according to this invention. The functions of the components of the sixth preferred embodiment are similar to those of the fourth preferred embodiment. The sixth preferred embodiment differs from the fourth preferred embodiment in that: The digital signal from the ADC 42 is first combined with the output of the second DAGC 46, which is responsible for processing the output of the interference canceller 45, to generate a combined signal. The combined signal is processed in sequence by the FFE 47 and the first DAGC 43 before undergoing further processing in the primary data processing path. The first DAGC 43 and the second DAGC 46 are set by the gain processing unit 44 in a manner similar to that in the fourth preferred embodiment.

In sum, through processing of the first DAGC 43 and the second DAGC 46, even though the level of the AAGC 411 changes with the signal power, the coefficients of the interference canceller 45, the FFE 47 and the FBE 48 are converged during initial setting of the AAGC 411 and need not undergo re-converging. For various applications (such as 10Gbase-T) that involve repeated adjustment of signal power of a transmitter and the receiver 4 when establishing a network connection, the process of establishing the network connection is made smoother accordingly.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method for gain control, comprising the steps of:
providing a gain-mapping table;
determining a first analog gain level according to a power of a far-end transmitted signal;
obtaining a first gain-mapping value from the gain-mapping table according to the first analog gain level;
obtaining a first digital gain value according to the first gain-mapping value;
adjusting a gain of a digital signal according to the first digital gain value,
determining a second analog gain level according to a power of a near-end interference signal; and
obtaining a second gain-mapping value from the gain-mapping table according to the second analog gain level.

2. The method of claim 1, wherein the first digital gain value is an inverse of the first gain-mapping value.

3. The method of claim 1, further comprising the step of: obtaining a second digital gain value according to the second gain-mapping value.

4. The method of claim 3, wherein the second digital gain value is an inverse of the second gain-mapping value.

5. The method of claim 1, further comprising the step of:
obtaining a second digital gain value according to the first and second gain-mapping values.

6. The method of claim 5, wherein the second digital gain value is a product of the first gain-mapping value and an inverse of the second gain-mapping value.

7. A receiver comprising:
an analog front end (AFE) including an analog auto gain controller (AAGC), the receiver determining a first analog gain level of the AAGC according to a power of a transmitted signal transmitted by a far-end device;
an analog-to-digital converter (ADC) for converting an output of the AFE into a digital signal;
a first digital auto gain controller (DAGC), disposed in a data processing path, for adjusting a gain of the digital signal;
a gain processing unit including a gain-mapping table, the gain processing unit obtaining a first gain-mapping value from the gain-mapping table according to the first analog gain level, and obtaining a first digital gain value of the first DAGC according to the first gain-mapping value; and
an interference canceller and a second DAGC, wherein the digital signal is processed by the first DAGC, output of the interference canceller is processed by the second DAGC, and outputs of the first and second DAGC are combined for subsequent processing in the data processing path.

8. The receiver of claim 7, wherein the first digital gain value is an inverse of the first gain-mapping value.

9. The receiver of claim 7, wherein the receiver determines a second analog gain level of the AAGC according to a power of a near-end interference signal.

10. The receiver of claim 9, wherein the gain processing unit further obtains a second gain-mapping value from the gain-mapping table according to the second analog gain level, and obtains a second digital gain value of the second DAGC according to the second gain-mapping value.

11. The receiver of claim 10, wherein the second digital gain value is an inverse of the second gain-mapping value.

12. The receiver of claim 9, wherein output of the second DAGC is combined with the digital signal to form a combined signal, and the combined signal is processed by the first DAGC.

13. The receiver of claim 12, wherein the gain processing unit further obtains a second gain-mapping value from the gain-mapping table according to the second analog gain level, and obtains a second digital gain value of the second DAGC according to the first and second gain-mapping values.

14. The receiver of claim 13, wherein the second digital gain value is a product of the first gain-mapping value and an inverse of the second gain-mapping value.

15. A receiver comprising:
an analog front end (AFE) for processing an analog signal received by the receiver, the AFE including an analog auto gain controller (AAGC) for adjusting an analog gain of the analog signal according to an analog gain value;

an analog-to-digital converter (ADC) for converting a processed analog signal from the AFE into a digital signal;

a data processing module for processing the digital signal from the ADC, the data processing module including a first digital auto gain controller (DAGC) for adjusting a gain of the digital signal according to a first digital gain value;

a gain processing unit, coupled to the first DAGC, for determining the first digital gain value according to the analog gain value;

an interference cancellation module coupled to the data processing module for generating a feedback signal to perform an interference cancellation process on the digital signal, the interference cancellation module including a second digital auto gain controller for adjusting a gain of the feedback signal according to a second digital gain value, wherein the gain processing unit is coupled to the second digital auto gain controller and determines the second digital gain value according to the analog gain value.

16. The method of claim 1, further comprising adjusting a gain of the second digital signal according to a second digital gain value, wherein the second digital gain value is based on a power of a near-end interference signal.

* * * * *